United States Patent
Staph et al.

(10) Patent No.: US 11,985,788 B1
(45) Date of Patent: May 14, 2024

(54) LOCATION-AWARE INVENTORY, CONFIGURATION, AND MANAGEMENT OF ELECTRONIC DEVICES

(71) Applicant: Dell Products L.P., Round Rock, TX (US)

(72) Inventors: Jason Staph, Altoona, PA (US); John Hogenmiller, Bedford, PA (US); Gabrielle Sweda, Berkley, MI (US); Neil Marini, Marietta, GA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/155,855

(22) Filed: Jan. 18, 2023

(51) Int. Cl.
  *G06K 7/14* (2006.01)
  *G06Q 10/087* (2023.01)
  *H05K 7/14* (2006.01)

(52) U.S. Cl.
  CPC ......... *H05K 7/1498* (2013.01); *G06K 7/1417* (2013.01); *G06Q 10/087* (2013.01)

(58) Field of Classification Search
  CPC ... H05K 7/1498; G06K 7/1417; G06Q 10/087
  USPC .......................................................... 235/385
  See application file for complete search history.

(56) References Cited

U.S. PATENT DOCUMENTS 10,447,974 B2 * 10/2019 Li ....................... H04L 41/0886
2015/0319879 A1 * 11/2015 Aimone ............... H05K 7/1498
                                                               235/375

OTHER PUBLICATIONS

U.S. Appl. No. 18/155,853, filed Jan. 18, 2023, Staph et al.

* cited by examiner

*Primary Examiner* — Daniel A Hess
(74) *Attorney, Agent, or Firm* — DALY, CROWLEY, MOFFORD & DURKEE, LLP

(57) ABSTRACT

In one aspect, an example system implementing the disclosed techniques includes an optically readable label provided at a U position of a plurality of U positions in a data center rack, wherein the optically readable label encodes location identifying information. The system also includes an optical reader provided in an electronic device, the optical reader configured to sense and read the location identifying information encoded on the optically readable label in response to being mounted in the U position in the data center rack and initial power on of the electronic device.

20 Claims, 9 Drawing Sheets

LOCATION-AWARE INVENTORY, CONFIGURATION, AND MANAGEMENT OF ELECTRONIC DEVICES

BACKGROUND

Electronic equipment racks, such as data center cabinets or racks, are standardized structures used to hold servers, storage, and networking equipment. For example, a rack may hold dozens of rack-mounted servers and associated storage, power supplies, network switches, and the like. Within a data center, the racks are generally organized into banks or isles and a large data center may have many racks (e.g., tens, hundreds, and, in some cases, thousands of racks). As a result, tracking the servers and other electronic devices mounted in the racks in a data center can be a monumental task.

SUMMARY

This Summary is provided to introduce a selection of concepts in simplified form that are further described below in the Detailed Description. This Summary is not intended to identify key or essential features or combinations of the claimed subject matter, nor is it intended to be used to limit the scope of the claimed subject matter.

In accordance with one illustrative embodiment provided to illustrate the broader concepts, systems, and techniques described herein, a system includes an optically readable label provided at a U position of a plurality of U positions in a data center rack, wherein the optically readable label encodes location identifying information. The system also includes an optical reader provided in an electronic device, the optical reader configured to sense and read the location identifying information encoded on the optically readable label in response to being mounted in the U position in the data center rack and initial power on of the electronic device.

In some embodiments, the optically readable label includes a data matrix code.

In some embodiments, the location identifying information includes information that indicates a location of the U position in the data center rack.

In some embodiments, the location identifying information includes information that identifies the data center rack.

In some embodiments, the electronic device is configured to send the read location identifying information to a management system, wherein the management system comprises non-transitory memory and a processor and is configured to validate the location of the electronic device.

In some embodiments, the electronic device is configured to not send the read location identifying information to a management system in response to a determination that a physical location of the electronic device has not changed.

In some embodiments, the location identifying information is read using an optical extension that extends from the optical reader. In one aspect, the optical extension includes an optical fiber. In one aspect, the optical extension extends to an opening in a rear-facing surface of a front panel of the electronic device. In one aspect, the opening is located in the rear-facing surface of the front panel of the electronic device to enable reading of the optically readable label by the optical reader.

According to another illustrative embodiment provided to illustrate the broader concepts described herein, a method includes providing an optically readable label provided at a U position of a plurality of U positions in a data center rack, wherein the optically readable label encodes location identifying information. The method also includes reading, by an optical reader provided in an electronic device, the location identifying information encoded on the optically readable label in response to the electronic device being mounted in the U position in the data center rack and initially powered on.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims appended hereto.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

FIG. 1' illustrates an enlarged portion of the vertical flange of the rack of FIG. 1, in accordance with an embodiment of the present disclosure.

FIG. 2' illustrates an enlarged portion of the rack rail of the rack of FIG. 2, in accordance with an embodiment of the present disclosure.

DETAILED DESCRIPTION

Reliable knowledge of the precise locations of electronic devices mounted in the multiple racks in a data center can be a challenge, particularly for large data centers, which can often include tens, hundreds or sometimes thousands of racks. Knowledge of the electronic device location information can assist in ensuring that the electronic device is deployed at the proper locations, as well as in configuring and managing the deployed electronic device. For example, cataloging and maintaining property records often happens after the deployment of the electronic device, through a laborious process of pulling serial numbers off the equipment that has been mounted into the racks. The racked equipment is then passed through several stages of configuration which do not alter the physical deployment, but which configure the equipment for use by the deploying organization. These stages may be automated, or they may be manual stages, but always involve using the logical and physical layout to inform the configuration of the equipment.

As will be explained in greater detail below, certain of the embodiments of the present disclosure are directed to using optically readable labels (or "tags") to provide location information. In some embodiments, optically readable labels, such as, for example, data matrix codes or other optically readable two-dimensional codes, may be provided at various locations on a data center rack. These labels may encode location identifying information that can be accessed by an optical reader. In some cases, each receptacle (e.g., rack unit (U)) of a rack within a data center may have an optically readable label that encodes the location of the individual receptacle. Then, when an electronic device is mounted into a receptacle, the location information encoded on an optically readable label associated with the receptacle can be read to obtain the physical location of the electronic device within the data center. The electronic device can then be managed based on the physical location of the electronic device.

It is noted that designations such "front," "rear," "top," "bottom," "side," "right side," etc. are not intended to necessarily implicate a limitation as to orientation of the embodiments described herein. Rather, such terminology is simply used for explanatory purposes in the examples provided below to describe the relative position of certain components or portions of components.

Figure 1:
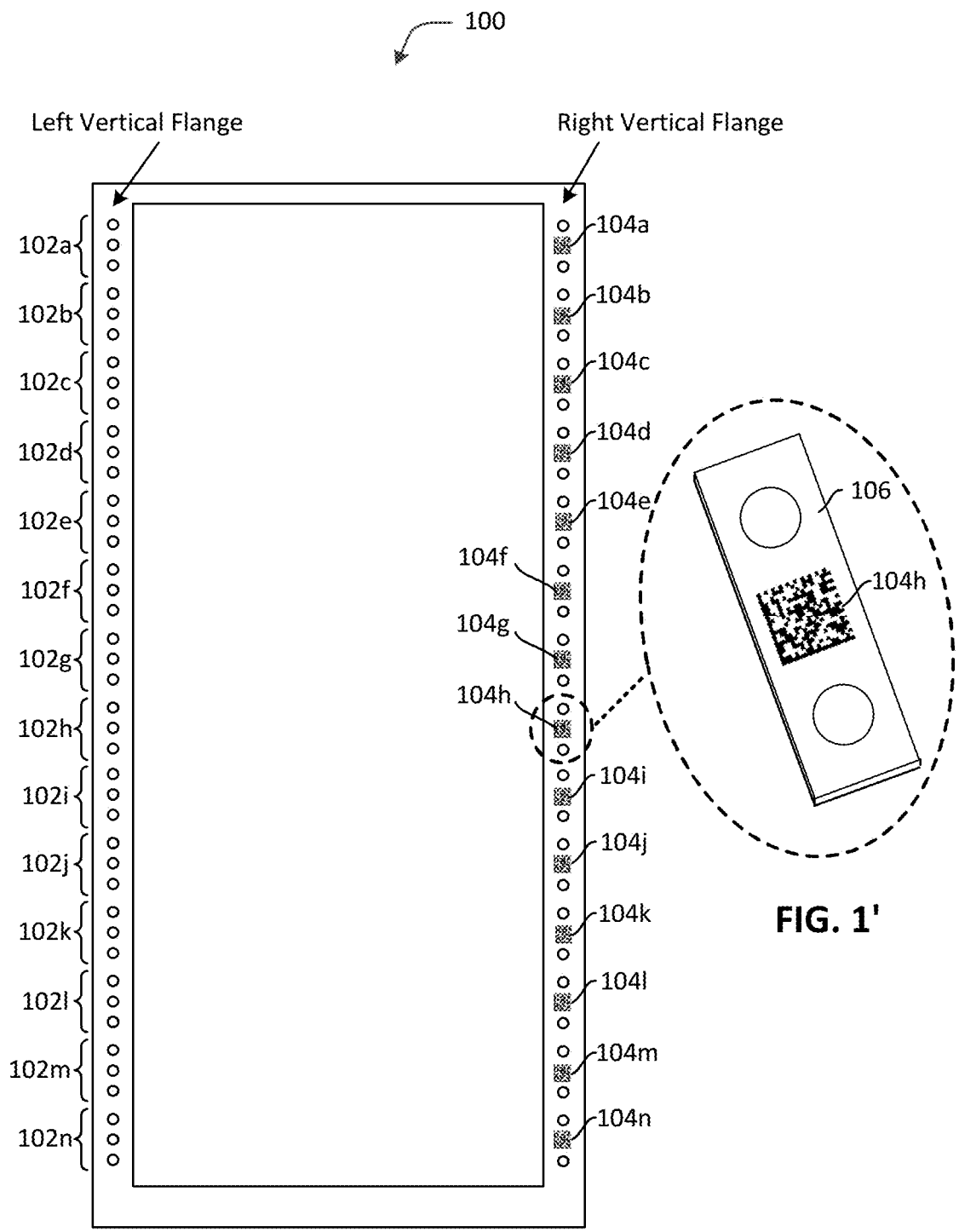
FIG. 1 illustrates a front view of an example datacenter rack having optically readable labels provided via interposers at positions on a vertical flange of the rack, in accordance with an embodiment of the present disclosure.

Turning now to the figures, FIG. 1 illustrates a front view of an example datacenter rack 100, in accordance with an embodiment of the present disclosure. Illustrated rack 100 is divided into U positions 102a-102n (102 generally). In the illustrated example, each U position 102 (sometimes referred to herein more simply as a "U") is spaced in groups of three holes provided in a left vertical flange and a right vertical flange of rack 100. The holes provided in the left and right vertical flanges of rack 100 enable mounting of electronic devices in rack 100. The number of U's included in rack 100 shown in FIG. 1 is merely illustrative and the structures and techniques sought to be protected herein are not limited to any particular number of U's. For example, a full-height rack may be 42 U high (i.e., divided into 42 U's) and a half-height rack may be typically 18-22 U high (i.e., divided into 18 to 22 U's).

As shown, the individual U positions 102 may include a corresponding optically readable label 104a-104n (104 generally). In one embodiment, optically readable label 104 may be in the form of a data matrix code. In other embodiments, optically readable label 104 may be in the form of a Quick Response (QR) code or other optically readable two-dimensional code. In the example shown, U position 102a may have a corresponding optically readable label 104a, U position 102b may have a corresponding optically readable label 104b, U position 102c may have a corresponding optically readable label 104c, U position 102d may have a corresponding optically readable label 104d, and so on. In some embodiments, optically readable labels 104 may be provided at regular, fixed positions on rack 100, such as vertically spaced on an outside surface of the right vertical flange of rack 100. Alternatively, one or more of the optically readable labels 104 may be vertically spaced on an outside surface of the left vertical flange of rack 100. In some embodiments, the individual optically readable labels 104 may be positioned between a top and a bottom hole of the three-hole group provided for each U position 102.

The individual optically readable labels 104 encode location identifying information that can be accessed by an optical reader. For example, optically readable label 104a provided at U position 102a can encode a location of U position 102a (i.e., location of the receptacle associated with U position 102a) in rack 100. Similarly, optically readable label 104b provided at U position 102b can encode the location of U position 102b in rack 100, optically readable label 104c provided at U position 102c can encode the location of U position 102c in rack 100, and so on. When an electronic device is mounted in a particular U position 102 in rack 100, an optical reader, such as an optical reader associated with the mounted electronic device, can be used to scan or otherwise read optically readable label 104 provided at U position 102 for the encoded data (e.g., the location of U position 102 in rack 100).

In the example of FIG. 1, optically readable label 104 is provided on rack 100 via an interposer such as, for example, a shim. As used herein, the term "shim" refers to a small, unobtrusive device which can be interposed between two mating surfaces. The shim can be interposed between an outside surface of a vertical flange of a rack and the racking hardware of an electronic device (e.g., a rear-facing surface of the electronic device front panel) when the electronic device is mounted in the rack. For example, as illustrated in FIG. 1' which shows an enlarged view of optically readable label 104h, optically readable label 104h is applied to a shim 106. The optically readable label (e.g., optically readable label 104h) can be applied to shim 106 using silk-screening or other suitable stenciling technique. Optically readable label 104h can be positioned on shim 106 to allow access by an optical reader when shim 106 is attached to the outside surface of the right vertical flange of rack 100 at U position 102h and an electronic device is mounted in U position 102h in rack 100. For example, as shown in the example of FIG. 1', optically readable label 104h can be positioned substantially towards the middle of shim 106 between an upper edge and an opposite lower edge of shim 106 on a surface of shim 106 opposite the surface that mates to rack 102. Note that, a result of such positioning on shim 106 is that optically readable label 104h is not visible (i.e., optically readable label 104h is hidden from view) when shim 106 is attached to the outside surface of the right vertical flange of rack 100 at U position 102h and an electronic device is mounted in U position 102h in rack 100.

In some embodiments, shim 106 is designed in a manner as to not alter the function and usability of rack 100 when attached to rack 100. Shim 106 is also designed to conform to rack 100 design standards. To this end, in some embodiments, shim 106 can include holes or openings that align with the holes provided in the left or right vertical flange of rack 100 when shim 106 is attached to the left or right vertical flange of rack 100. For example, as illustrated in FIG. 1', shim 106 can include an upper hole and a lower hole which align with the top hole and the bottom hole of the three-hole group provided for U position 102h when shim 106 with applied optically readable label 104h is attached to the outside surface of the right vertical flange of rack 100. The alignment of the holes enables the use of the holes of shim 106 and the vertical flange of rack 100 to mount an electronic device in rack 100. Shim 106 can be attached or otherwise affixed to rack 100 (e.g., the right vertical flange of rack 100) using various attachment means (e.g., adhesives, Epoxy resins, screws, rivets, etc.). In some embodiments, the electronic device's own mounting hardware may potentially be used to position and retain shim 106.

In some embodiments, optically readable labels 104 can be attached to rack 100 during manufacturing of rack 100. For example, shims 106 having optically readable labels 104 applied thereto can be attached to rack 100 during manufacturing of rack 100. In some embodiments, existing racks 100 without optically readable labels can be retrofitted with shims 106 having optically readable labels 104 applied thereto.

Figure 2:
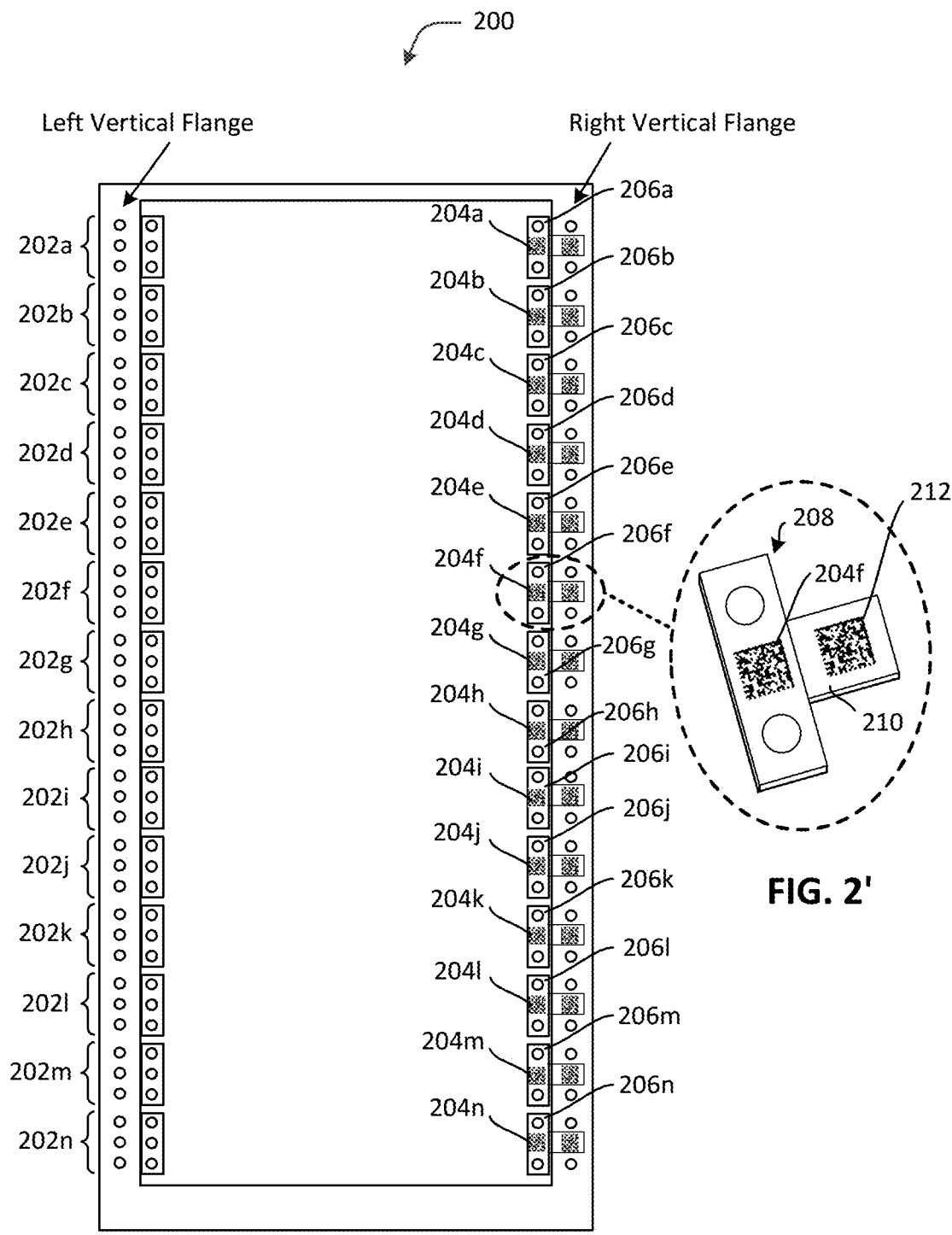
FIG. 2 illustrates a front view of an example datacenter rack having optically readable labels provided via interposers on mounting brackets of a rack rail of the rack, in accordance with an embodiment of the present disclosure.

FIG. 2 illustrates a front view of an example datacenter rack 200, in accordance with an embodiment of the present disclosure. Illustrated rack 200 is divided into U positions 202a-202n (202 generally). Rack 200 can be the same as or similar to rack 100 of FIG. 1.

In the illustrated example, each U position 202 (i.e., receptacle) in rack 200 may include a corresponding rack rail 206a-206n (206 generally). For example, rack rails 206 can be attached to or otherwise installed in rack 200. The individual rack rails 206 can provide a front mounting bracket that includes an upper hole towards an upper edge of the mounting bracket and a lower hole towards an opposite lower edge of the mounting bracket to enable mounting of an electronic device in rack 200 using rack rails 206. The number of rack rails 206 included in rack 200 shown in FIG. 2 is merely illustrative and the structures and techniques sought to be protected herein are not limited to any particular number of rack rails. For example, one or more U positions 202 may not include rack rails 206.

As shown, the individual rack rails 206 may include a corresponding optically readable label 204a-204n (204 generally). Optically readable label 204 can be the same as or similar to optically readable label 104 of FIG. 1. In some embodiments, optically readable label 204 can be provided on the front mounting bracket of rack rail 206. For example, optically readable label 204 can be provided on an outside surface of the front mounting bracket of rack rail 206. Also, similar to optically readable label 104 of FIG. 1, optically readable label 204f is provided on rack rail 206f via a shim 208, as illustrated in FIG. 2'. Optically readable label 204f can be positioned on shim 208 to allow access by an optical reader when shim 208 is attached to the outside surface of the front mounting bracket of rack rail 206f and an electronic device is mounted in rack 200 using rack rail 206f. For example, as shown in the example of FIG. 2', optically readable label 204f can be positioned substantially towards the middle of shim 208 between an upper edge and an opposite lower edge of shim 208 on a surface of shim 208 opposite the surface that mates to the front mounting bracket of rack rail 206f. Note that, a result of such positioning on shim 208 is that optically readable label 204f is not visible (i.e., optically readable label 204f is hidden from view) when shim 208 is attached to the outside surface of the front mounting bracket of rack rail 206f and an electronic device is mounted in rack 200 using rack rail 206f.

In some embodiments, shim 208 is designed in a manner as to not alter the function and usability of rack rail 206 when rack rail 206 is attached to rack 200. To this end, in some embodiments, shim 208 can include holes or openings that align with the holes provided in the front mounting bracket of rack rail 206 when shim 208 is attached to the outside surface of the front mounting bracket of rack rail 206. For example, as illustrated in FIG. 2', shim 208 can include an upper hole and a lower hole which align with the top hole and the bottom hole of the front mounting bracket of rack rail 206f when shim 208 with applied optically readable label 204f is attached to the outside surface of the front mounting bracket of rack rail 204f. The alignment of the holes enables the use of the holes of shim 208 and the front mounting bracket of rack rail 206 to mount an electronic device in rack 200 using rack rail 206.

In some embodiments, shim 208 can include a shim extension 210 extending outwardly from a side of shim 208. In such embodiments, shim extension 210 can extend outward from a side of shim 206 that is towards the outside of rack 200 when attached to the outside surface of the front mounting bracket of rack rail 204. In some embodiments, shim extension 210 can have an optically readable label 212 applied thereto. Optically readable label 212 can be the same or similar to optically readable label 204. In some embodiments, optically readable label 204 may not be provided on shim 208 when optically readable label 212 is provided on shim extension 210.

In some embodiments, optically readable labels 204 can be attached to the front mounting brackets of rack rails 206 during manufacturing of rack rails 206. For example, shims 208 having optically readable labels 204 and/or optically readable labels 212 applied thereto can be attached to the front mounting brackets of rack rails 206 during manufacturing of rack rails 206. In some embodiments, existing rack rails 206 without optically readable labels can be retrofitted with shims 208 having optically readable labels 204 and/or optically readable labels 212 applied thereto.

Figure 3:
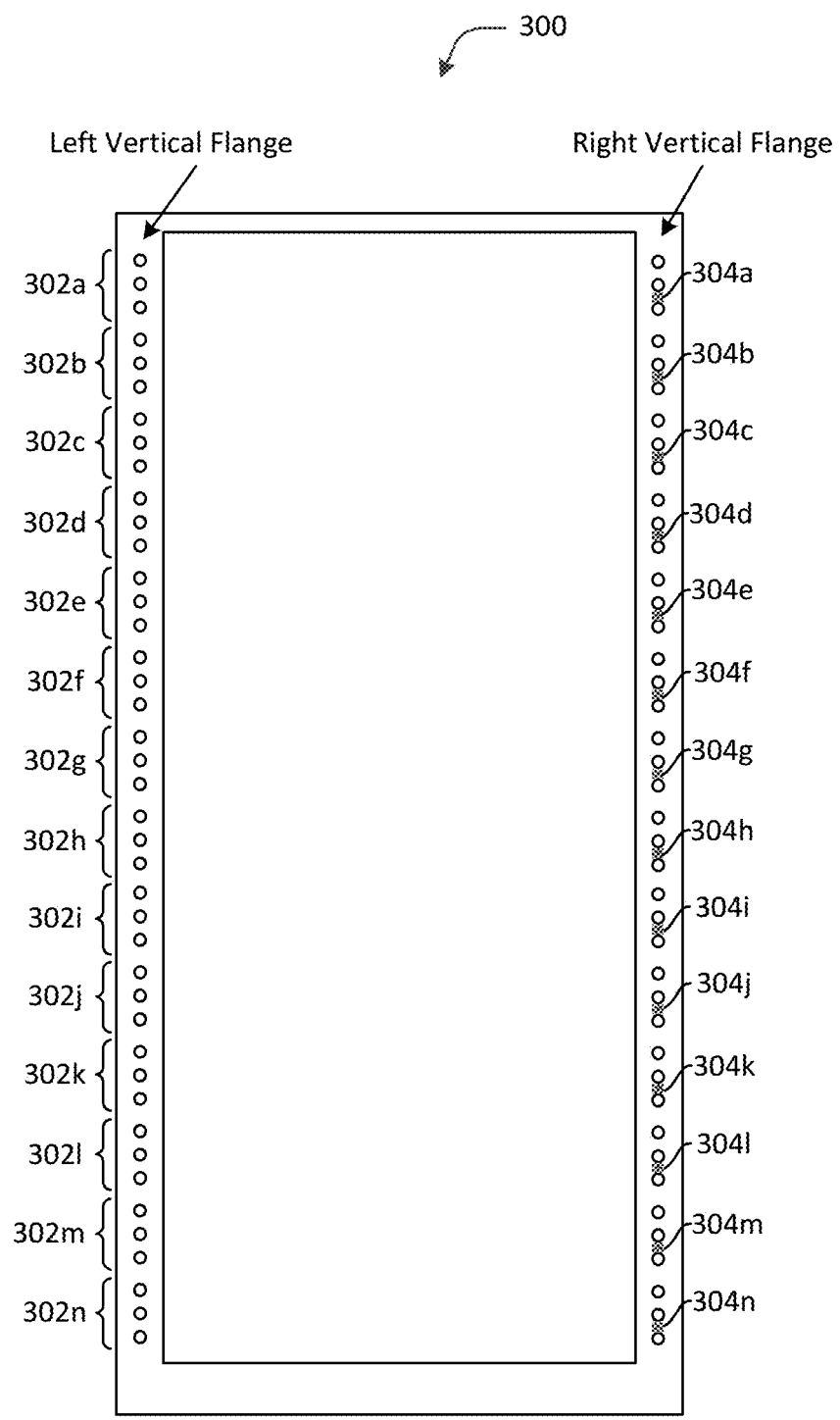
FIG. 3 illustrates a front view of an example datacenter rack having optically readable labels provided at positions on a vertical flange of the rack, in accordance with an embodiment of the present disclosure.

FIG. 3 illustrates a front view of an example datacenter rack 300 having optically readable labels provided at positions on a vertical flange of rack 300, in accordance with an embodiment of the present disclosure. Illustrated rack 300 is divided into U positions 302a-302n (302 generally). Rack 300 can be the same as or similar to rack 100 of FIG. 1 or rack 200 of FIG. 2.

In the illustrated example, the individual U positions 302 may include a corresponding optically readable label 304a-304n (304 generally). Optically readable label 304 can be the same as or similar to optically readable label 104 of FIG. 1. However, different from optically readable labels 104, optically readable label 304 is not provided on rack 300 via an interposer, such as a shim. In other words, optically readable labels 304 are not applied to shims which are in turn attached to rack 300. Rather, optically readable label 304 can be in the form of a "sticker" which can be attached directly to rack 300.

In the example of FIG. 3, optically readable labels 304 can be attached to an outside surface of a right vertical flange of rack 300 between the bottom two holes of the three-hole group provided for the individual U positions 302. In other embodiments, optically readable labels 304 can be attached to the outside surface of the right vertical flange of rack 300 between the top two holes of the three-hole group provided for the individual U positions 302. In other embodiments, optically readable labels 304 can be attached to the outside surface of the right vertical flange of rack 300 over the middle hole of the three-hole group provided for the individual U positions 302. In any case, optically readable labels 304 can be attached to rack 300 in a manner as to not alter the function and usability of rack 300 when attached to rack 300. Additionally, optically readable labels 304 can be attached at positions on the outside surface of the right vertical flange of rack 300 to allow access by an optical reader when electronic devices are mounted in various U positions 302 in rack 300. When positioned in such manner, optically readable label 304 may be not visible (i.e., may be hidden from view) when an electronic device is mounted in rack 300.

Figure 4:
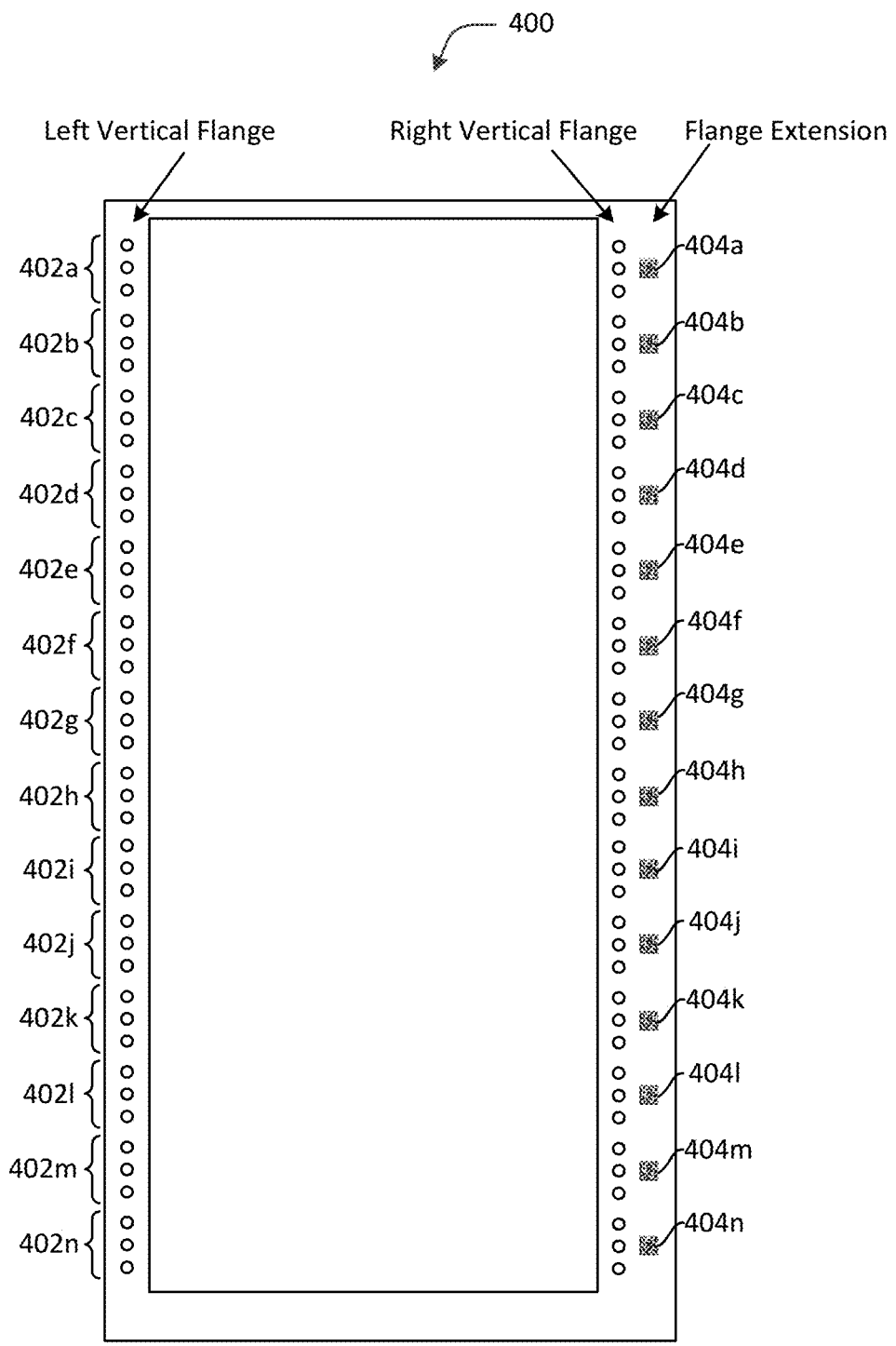
FIG. 4 illustrates a front view of an example datacenter rack having optically readable labels provided at positions on an extension of a vertical flange of the rack, in accordance with an embodiment of the present disclosure.

FIG. 4 illustrates a front view of an example datacenter rack 400 having optically readable labels provided at positions on an extension of a vertical flange of rack 400, in accordance with an embodiment of the present disclosure. Illustrated rack 400 is divided into U positions 402*a*-402*n* (402 generally). Rack 400 can be the same as or similar to rack 100 of FIG. 1, rack 200 of FIG. 2, or rack 300 of FIG. 3.

In the illustrated example, the individual U positions 402 may include a corresponding optically readable label 404*a*-404*n* (404 generally). Optically readable label 404 can be the same as or similar to optically readable label 304 of FIG. 3. In the example of FIG. 4, optically readable labels 404 can be attached to an outside surface of an extension of a right vertical flange of rack 400. For a particular U position 402, optically readable label 404 can be attached at a position on the outside surface of the extension of the right vertical flange of rack 400 to allow access by an optical reader when an electronic device is mounted in U position 302 in rack 400.

Figure 5:
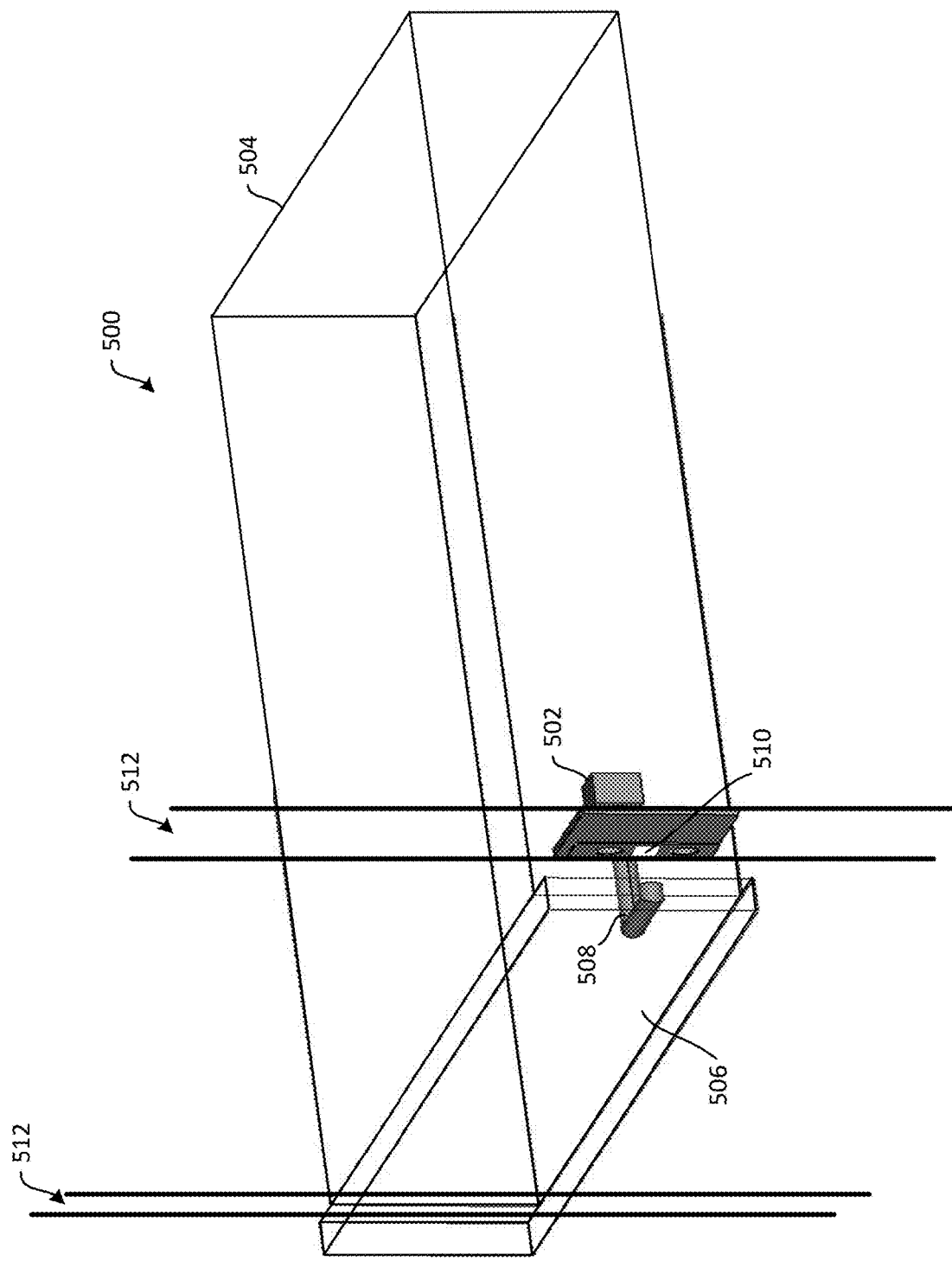
FIG. 5 illustrates an example electronic device including an optical reader, in accordance with an embodiment of the present disclosure.

FIG. 5 illustrates an example electronic device 500 including an optical reader 502, in accordance with an embodiment of the present disclosure. Non-limiting examples of electronic device 500 include servers, storage systems, network equipment (e.g., switches, routers, etc.), power distribution units (PDUs), and uninterruptable power supplies (UPS), among other rack mountable equipment. Optical reader 502 can be provided as a component of electronic device 500 and operates to read or otherwise access information encoded on an optically readable label. For example, optical reader 502 can be configured to read location identifying information encoded on an optically readable label, such as any of optically readable labels 104, 204, and/or 304 described herein with respect to FIGS. 1, 2, and 3, respectively.

In the example of FIG. 5, optical reader 502 can be provided as a component within a casing 504 of electronic device 500. As illustrated, optical reader 502 can be attached to an interior surface of a side panel of casing 504 enclosing electronic device 500. In some embodiments, optical reader 502 can be attached at a position (i.e., location) on the interior surface of the side panel of casing 504 where optical reader 502 does not impact the functionality of casing 504 and/or electronic device 500 (e.g., other components of electronic device 500). In other words, optical reader 502 may be provided within electronic device 500 such that there is little or no modification to the components of electronic device 500. For example, in one such embodiment, optical reader 502 can be attached at a position on the interior surface of the side panel of casing 504 towards a front panel 506 of electronic device 500 (e.g., towards front panel 506 of casing 504).

As can be seen in FIG. 5, an optical extension 508 can extend from optical reader 502 to allow optical reader 502 to read information encoded on an optically readable label external to electronic device 500, such as an optically readable label 510 attached to a rack 512. For example, optical extension 508, such as an optical fiber or suitable fiber optic sensor cable, can extend from an input component (e.g., a lens) of optical reader 502 along the interior surface of the side panel of casing 504 towards front panel 506. In some implementations, optical extension 508 may be a pipe or tube with embedded mirrors or other suitable reflector elements, for example, at the bends in the pipe or tube. The reflector elements may be included to provide the necessary signal strength through the bend(s) and along the pipe or tube. In some such implementations, optical extension 508 may operate similar to a telescope or periscope. Optical extension 508 can extend into front panel 506 and, within front panel 506, extend toward a side edge of front panel 506 to an opening in a rear-facing surface of front panel 506. The rear-facing surface of front panel 506 in which the opening is located mates to a vertical flange of rack 512 when electronic device 500 is mounted in rack 512. In one embodiment, a conduit or duct (e.g., a mini-duct) may be provided from optical reader 502 to the opening in the rear-facing surface of front panel 506 within which to route optical extension 508.

The opening in the rear facing surface of front panel 506 can be located in the rear-facing surface of front panel 506 to enable reading of an optically readable label provided on an equipment rack (e.g., rack 514). For example, the opening can be located to sufficiently position the end of optical extension 508 at or extending from the opening to enable optical reader 502 to read the information encoded on optically readable label 510 provided at a U position in rack 514 when electronic device 500 is mounted in the U position in rack 514.

It should be understood that the positioning of optical reader 502 on the interior surface of casing 504 of electronic device 500 is merely illustrative and not intended to be limiting. For example, depending on the type of electronic device 500 and/or type of optical reader 502, optical reader 502 can be attached to the interior surface of casing 504 enclosing electronic device 500 at other locations than that illustrated in FIG. 5. Furthermore, the routing of optical extension 508 from optical reader 502 to the opening in the rear-facing surface of front panel 506 can be different than that illustrated in FIG. 5. It should also appreciated in light of this disclosure that the opening for the optical extension from the optical reader to enable reading of an optically readable label can be located in a rear-facing surface of the opposite side of the front panel (e.g., left side of the front panel) than that illustrated in FIG. 5. This will allow for reading of an optically readable label provided on a left vertical flange of an equipment rack.

Figure 6:
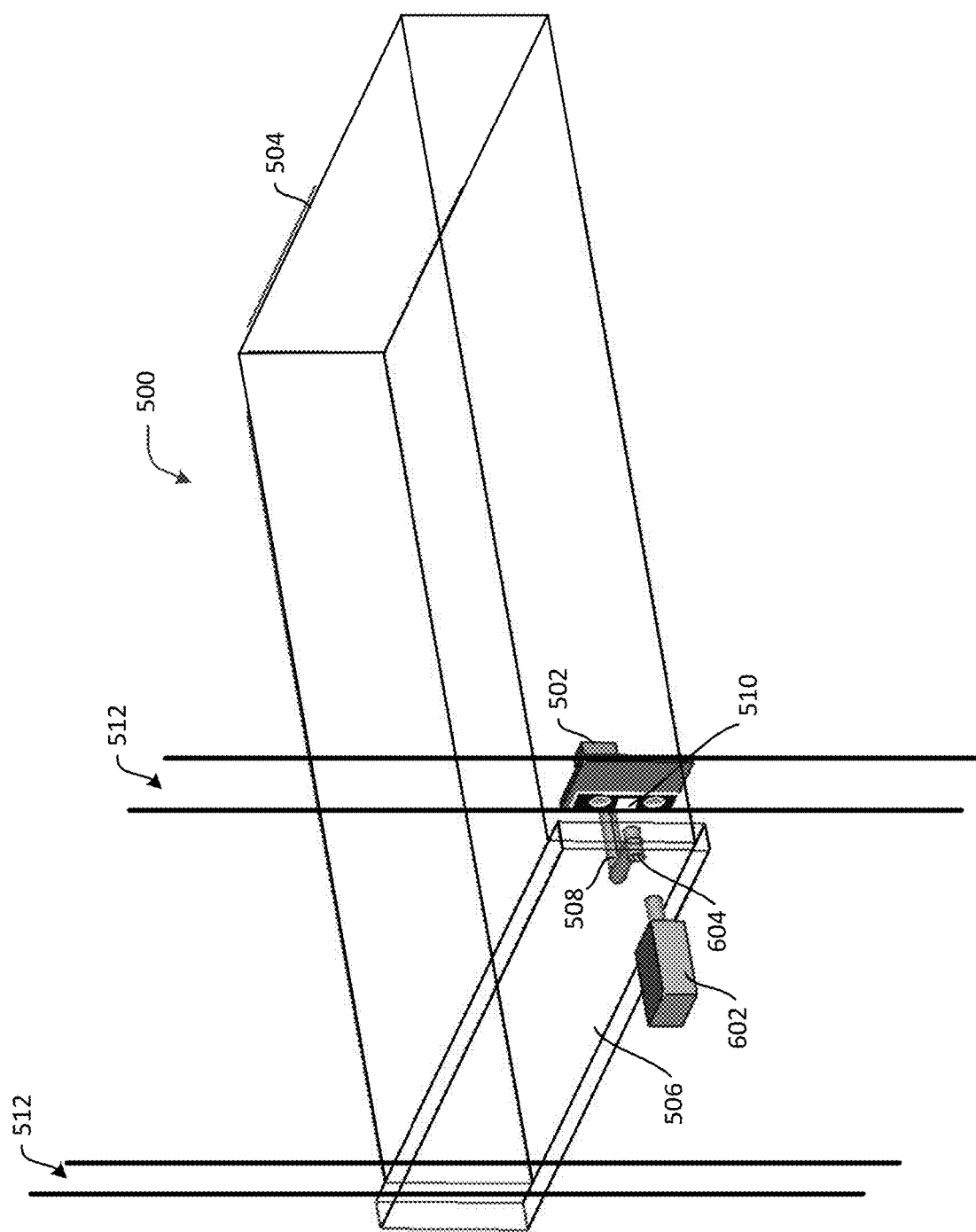
FIG. 6 illustrates an example electronic device that supports a portable optical reader, in accordance with an embodiment of the present disclosure.

Turning to FIG. 6 and with continued reference to FIG. 5, shown is electronic device 500 modified to support a portable optical reader 602, in accordance with an embodiment of the present disclosure. As shown, a channel 604 can be provided in front panel 506 extending from a front-facing surface of front panel 506 to the opening in the rear-facing surface of front panel 506 provided for optical extension 508 of optical reader 502. In operation, when electronic device 500 is mounted in a U position in rack 514, portable optical reader 602 can be pressed or inserted into an opening of channel 604 in front panel 506 to read the information (e.g., location identifying information) encoded on optically readable label 510 provided at the U position in rack 514. Portable optical reader 602 can send the location identifying information read from optically readable label 510 to electronic device 500. For example, the location identifying information can be sent using BLUETOOTH or other suitable short-range communication technology. As a result, electronic device 500 is able to determine its physical location even in cases where optical reader 502 may be inoperable. In addition, providing channel 604 enables access to optically readable label 510 by portable optical reader 602 without having to unmount electronic device 500 from rack 514. In some embodiments, inserting portable optical reader 602 into the opening of channel 604 can cause a reflector included in optical extension 508 to move out of channel 604 (e.g., rotate about 90 degrees) to enable portable optical reader 602 to read optically readable label 510.

Figure 7:
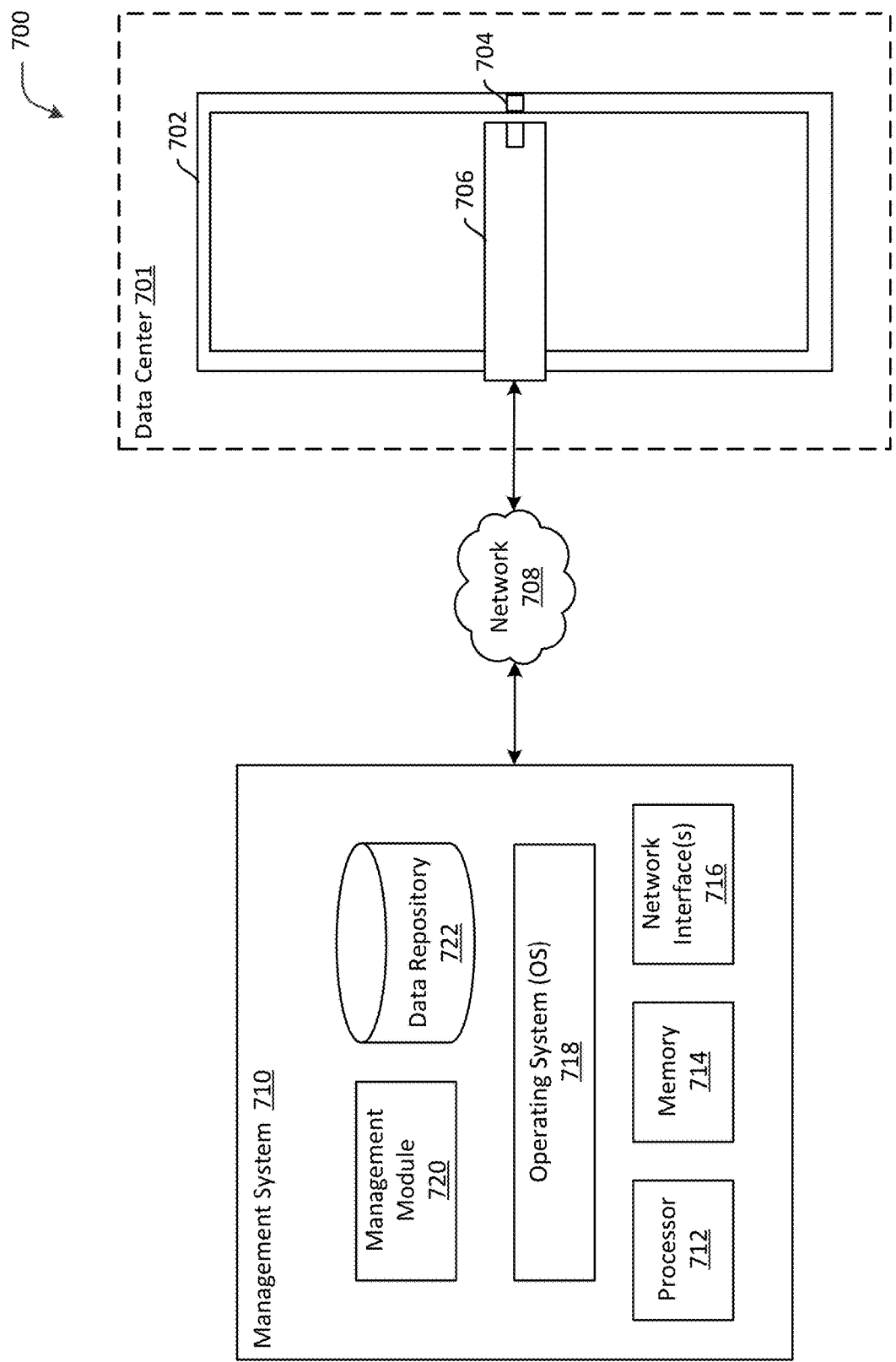
FIG. 7 is a block diagram of an illustrative system for location-aware inventory, configuration, and management in a data center, in accordance with an embodiment of the present disclosure.

FIG. 7 is a block diagram of an illustrative system 700 for location-aware inventory, configuration, and management in a data center 701, in accordance with an embodiment of the present disclosure. As shown, data center 701 includes a datacenter rack 702. Rack 702 can be the same or similar to rack 100 of FIG. 1, rack 200 of FIG. 2, rack 300 of FIG. 3, and/or rack 400 of FIG. 4. Rack 702 can be one of a large number and, in some cases, a very large number of racks in data center 701.

As described previously, rack 702 can provide optically readable labels at the various U positions in rack 702. For example, as shown in FIG. 7, an optically readable label 704 can be provided at a particular U position in rack 702. Optically readable label 704 can encode location identifying information such as a location of the receptacle associated with optically readable label 704 in rack 702. In some cases, optically readable label 704 can encode information identifying rack 702 in data center 701. While only one optically readable label is depicted in FIG. 7 for purposes of clarity, it will be appreciated that multiple optically readable labels can be provided at various positions on rack 701 and on other racks (not depicted) in data center 701.

In operation, when an electronic device 706, which can be the same or similar to electronic device 500 of FIG. 5, is mounted in the U position in rack 702, an optical reader (e.g., optical reader 502 of FIG. 5) of electronic device 706 can read the information encoded on optically readable label 704. For example, when electronic device 706 is mounted in rack 702 and initially powered on, the optical reader of electronic device 706 can sense optically readable label 704 and read the location identifying information encoded on optically readable label 704. In response, electronic device 706 can check to determine whether the newly read location information matches or is the same as the location information stored in memory (e.g., previously read location information stored in non-volatile memory). If the newly read location information does not match the location information stored in memory, electronic device 706 can send the newly read location information to a management system 710 via a network 708. In some cases, electronic device 706 can send the newly read location information to management system 710 without checking the location information stored in memory. The location information sent to management system 710 may also include electronic device 706 identifying information (e.g., device serial number).

Network 708 may correspond to one or more wireless or wired computer networks including, but not limited to, local-area networks (LANs), metropolitan area networks (MANs), wide area networks (WANs), wireless local-area networks (WLAN), primary public networks, primary private networks, cellular networks, Wi-Fi (i.e., 802.11) networks, BLUETOOTH networks, the Internet, and/or any other suitable type of communications network. In some embodiments, network 708 may include another network or a portion or portions of other networks.

Referring to management system 710, management system 710 is operable to provide location-aware inventory, configuration, and management of electronic devices in a data center. To this end, as shown in FIG. 7, illustrative system 710 can include a processor 712, a memory 714, one or more network interfaces 716, an operating system (OS) 718, a management module 720, and a data repository 722. Memory 714 can store executable instructions for an operating system (e.g., OS 718) and one or more applications, and processor 712 can be configured to execute/run the OS and applications using the stored executable instructions. Network interfaces 716 may include one or more interfaces to enable management system 710 to access a computer network such as network 708.

Management module 720 can be configured to manage electronic devices in a data center (e.g., data center 701). In some embodiments, in response to the location information being received from electronic device 706, management module 720 can use the received location information to validate the location of electronic device 706 in data center 701. For example, management module 720 can validate the location based on the correct or expected equipment location information maintained in data repository 722. In some embodiments, data repository 722 may correspond to a storage service within the computing environment of management system 710.

Upon validating the location of electronic device 706, management module 720 can initiate various workflows for electronic device 706 based on the validated location of electronic device 706. For example, the initiated workflow may include updating a current location of electronic device 706 in data repository 722. As another example, the initiated workflow may include sending the updated location information (i.e., current location information) to electronic device 706. As another example, the initiated workflow may include deleting all configuration on electronic device 706 and performing a factory reset of electronic device 706. As still another example, the initiated workflow may include performing a manufacturing-only diagnostics on electronic device 706. As another example, the initiated workflow may include configuring electronic device 706 based on a configuration profile defined for the current location of electronic device 706. As still another example, the initiated workflow may include locking electronic device 706 from further configuration. As another example, the initiated workflow may include assigning new administrative passwords (e.g., administrative default passwords) based on the location of electronic device 706. The examples of workflows described above are merely illustrative and may vary depending on the location, type, and/or capabilities of the electronic device.

Figure 8:
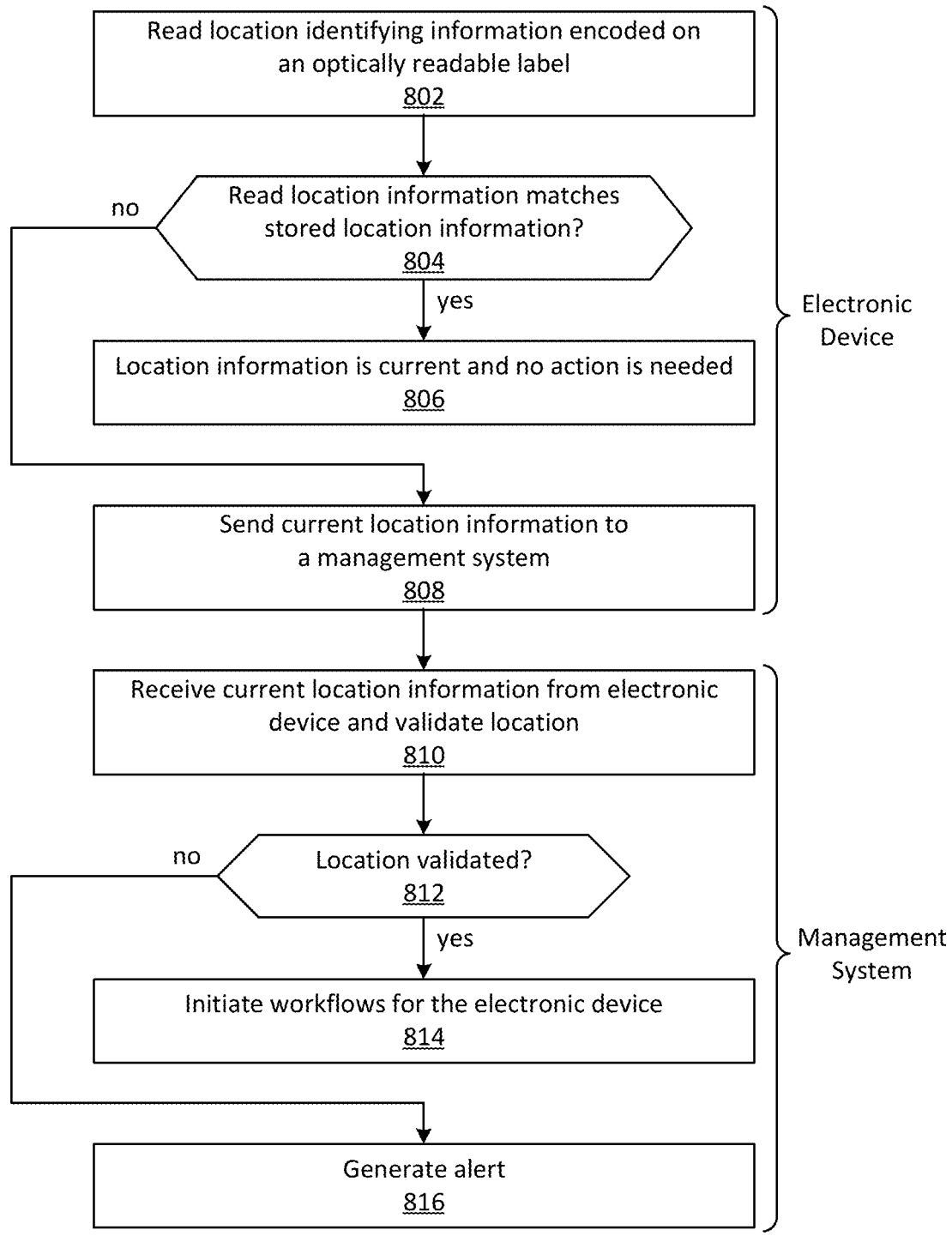
FIG. 8 is a flow diagram of an example process for location-aware inventory, configuration, and management, in accordance with an embodiment of the present disclosure.

FIG. 8 is a flow diagram of an example process 800 for location-aware inventory, configuration, and management, in accordance with an embodiment of the present disclosure. Illustrative process 800 may be implemented, for example, within system 700 of FIG. 7 and executed in response to an electronic device being mounted in a data center rack in a data center (e.g., in response to electronic device 500 of FIG. 5 being inserted into any of racks 100, 200, 300, or 400 of FIGS. 1-4, respectively).

With reference to process 800 of FIG. 8, at 802, location identifying information encoded on an optically readable label may be read. For purposes of this discussion, the optically readable label may be provided at a U position in the rack and an electronic device (e.g., electronic device 500 of FIG. 5) may read the location identifying information when mounted in the U position in the rack and initially powered on. The electronic device can use its optical reader (e.g., optical reader 502 of FIG. 5) to read the location identifying information encoded on the optically readable label. In some cases, a portable optical reader (e.g., portable optical reader 602 of FIG. 6) can be used to read the location identifying information encoded on the optically readable label. For example, the optical reader of the electronic device may be inoperable or otherwise unable to sense and read the optically readable label. In such cases, the portable optical reader can be used to read the location identifying information and send the read location identifying information to the electronic device. The location identifying information can include information that indicates the location of the U position (e.g., location of the receptacle) in the rack. The location identifying information can also include information that identifies the rack.

At 804, a check may be performed to determine whether the read location information matches the stored location information. For example, the electronic device can maintain the most previously or most recently read location information in memory. The electronic device may then use the previously read location information from memory to determine whether its location has changed since the last time the location identifying information was read from an optically readable label (e.g., determine whether the location of the electronic device in the data center has changed).

If, at 804, a determination is made that the read location information matches (i.e., is the same as) the stored location information, then, at 806, it may be determined that the location information is current, and no further action is needed. In this case, since the read location information is the same as the most previously read location information, the electronic device can determine that its physical location has not changed. In other words, the electronic device can determine that its current physical location as indicated by the read location information is the same as the last recorded physical location as indicated by the location information in memory. In some embodiments, since there is no change in the physical location of the electronic device, the electronic device does not send the read location information to a management system (e.g., management system 710 of FIG. 7).

Otherwise, if, at 804, a determination is made that the read location information does not match (i.e., is not the same as) the stored location information, then, at 808, the read location information (i.e., the current location information) may be sent to the management system. In this case, since the read location information is not the same as the most previously read location information, the electronic device can determine that its physical location has changed. In other words, the electronic device can determine that its current physical location as indicated by the read location information is not the same as the last recorded physical location as indicated by the location information in memory. In some embodiments, the electronic device can also send device identifying information (e.g., the electronic device's serial number) to the management system.

At 810, the location information sent by the electronic device may be received and validated. For example, the management system can receive location information from the electronic device and validate the location of the electronic device in the data center. In some embodiments, the management system may maintain a layout of the data center (e.g., information about the correct or expected location of the racks and the electronic devices in the racks in the data center) in a data repository (e.g., data repository 722 of FIG. 7).

At 812, a check may be performed to validate the location of the electronic device. For example, the management system can validate the location by comparing the location information received from the electronic device with the correct location of the electronic device as maintained in the data repository.

If, at 812, the location of the electronic device is validated, then, at 814, one or more workflows may be generated for the electronic device. For example, the management system can initiate the one or more workflows, as previously described herein, for the electronic device. In this case, the workflows are initiated based on the validated location of the electronic device in the data center.

Otherwise, if, at 812, the location of the electronic device is not validated, then, at 816, an alert may be generated. For example, the management system can generate a notification informing that the electronic device is at an incorrect or unexpected location (e.g., physical location) in the data center. For example, the notification may be in the form of an email to a system administrator informing of the incorrect location of the electronic device. As another example, the notification may be in the form of an alert message displayed on a console or dashboard of the management system. In any case, the notification can alert the system administrator and/or other user of the possible error in location of the electronic device.

Figure 9:
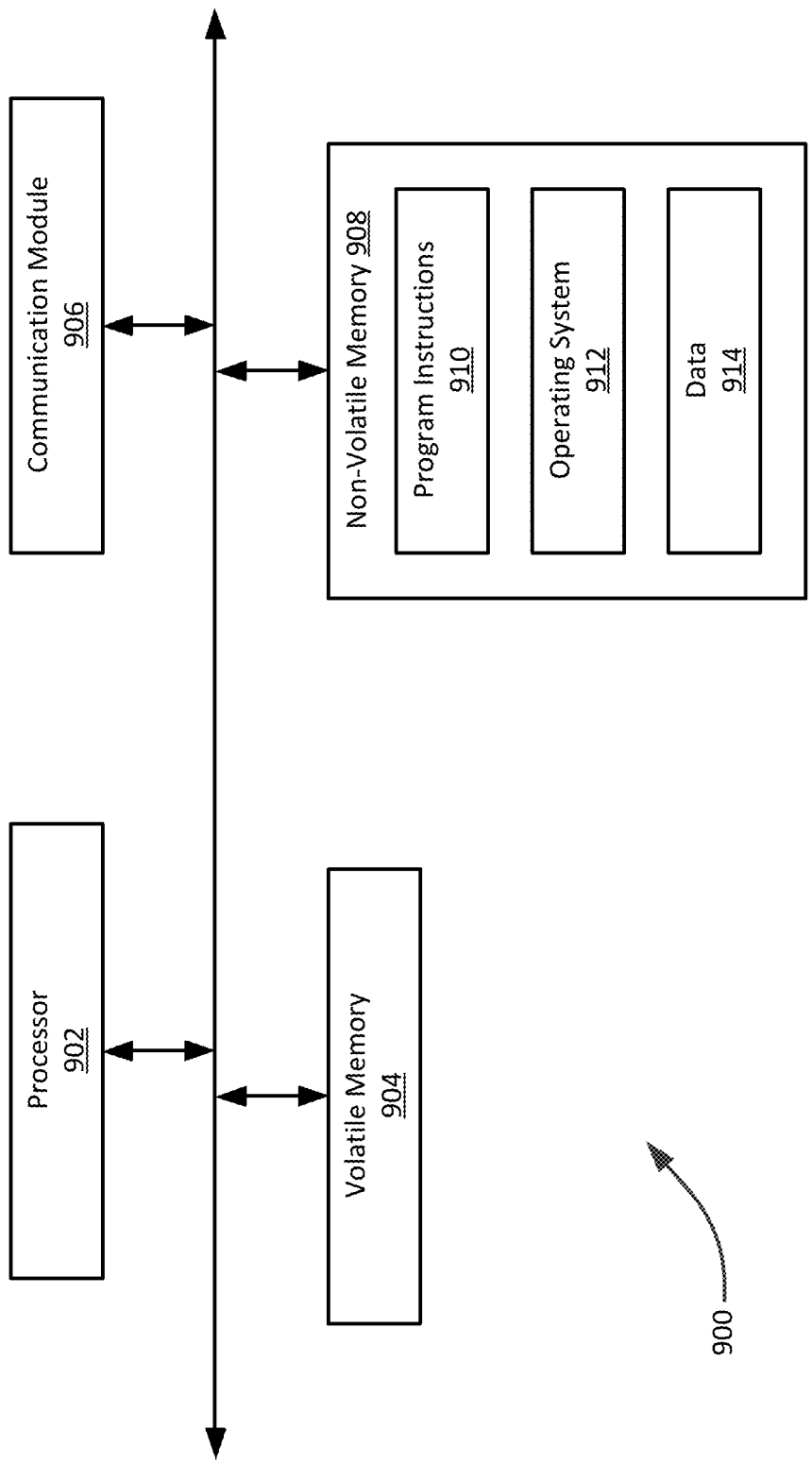
FIG. 9 is a block diagram illustrating selective components of an example computing device in which various aspects of the disclosure may be implemented, in accordance with an embodiment of the present disclosure.

FIG. 9 is a block diagram illustrating selective components of an example computing device 900 in which various aspects of the disclosure may be implemented, in accordance with an embodiment of the present disclosure. In some embodiments, computing device 900 may be configured to implement or direct one or more operations associated with some or all of the components and/or modules associated with electronic device 500 of FIG. 5 and/or management module 720 of FIG. 7. In one example case, for instance, each of the processes and/or operations performed by management module 720 as described herein may be stored on a non-volatile memory 908 (e.g., a hard disk), loaded in a volatile memory 904 (e.g., random access memory (RAM)), and executable by a processor 902. However, the illustrated computing device 900 is shown merely as an example and one skilled in the art will appreciate that management module 720 of FIG. 7 may be implemented by any computing or processing environment and with any type of machine or set of machines that may have suitable hardware and/or software capable of operating as described herein.

As shown in FIG. 9, computing device 900 includes processor 902, volatile memory 904 (e.g., random access memory (RAM)), a communication module 906, and non-volatile memory 908. Processor 902, volatile memory 904, communication module 906, and non-volatile memory 908 may be communicatively coupled. In various embodiments, additional components (not illustrated, such as a display, communication interface, input/output interface, etc.) or a subset of the illustrated components can be employed without deviating from the scope of the present disclosure.

Non-volatile memory 908 may include: one or more hard disk drives (HDDs) or other magnetic or optical storage media; one or more solid state drives (SSDs), such as a flash drive or other solid-state storage media; one or more hybrid magnetic and solid-state drives; and/or one or more virtual storage volumes, such as a cloud storage, or a combination of such physical storage volumes and virtual storage volumes or arrays thereof.

Non-volatile memory 908 stores program instructions 910, an operating system 912, and data 914 such that, for example, computer instructions of operating system 912 and/or program instructions 910 are executed by processor 902 out of volatile memory 904. For example, in some embodiments, program instructions 910 and data 914 may cause computing device 900 to implement functionality in accordance with the various embodiments and/or examples with respect to management module 720 of FIG. 7 described herein. In some embodiments, volatile memory 904 may include one or more types of random access memory (RAM) and/or a cache memory that may offer a faster response time than a main memory.

Processor 902 may be implemented by one or more programmable processors to execute one or more executable instructions, such as program instructions 910 and/or a computer program, to perform or direct performance of any number of operations described in the present disclosure. As used herein, the term "processor" describes circuitry that performs a function, an operation, or a sequence of operations. The function, operation, or sequence of operations may be hard coded into the circuitry or soft coded by way of instructions held in a memory device and executed by the circuitry. A processor may perform the function, operation, or sequence of operations using digital values and/or using analog signals.

In some embodiments, processor 902 can be embodied in one or more application specific integrated circuits (ASICs), microprocessors, digital signal processors (DSPs), graphics processing units (GPUs), microcontrollers, field programmable gate arrays (FPGAs), programmable logic arrays (PLAs), multi-core processors, or general-purpose computers with associated memory. Processor 902 may be analog, digital, or mixed signal. In some embodiments, processor 902 may be one or more physical processors, or one or more virtual (e.g., remotely located or cloud computing environment) processors. A processor including multiple processor cores and/or multiple processors may provide functionality for parallel, simultaneous execution of instructions or for parallel, simultaneous execution of one instruction on more than one piece of data.

Communication module 906 can be any appropriate network chip or chipset which allows for wired or wireless communication via a network, such as, by way of example, a local area network (e.g., a home-based or office network), a wide area network (e.g., the Internet), a peer-to-peer network (e.g., a Bluetooth connection), or a combination of such networks, whether public, private, or both. Communication module 906 can also be configured to provide intra-device communications via a bus or an interconnect.

In the foregoing detailed description, various features of embodiments are grouped together for the purpose of streamlining the disclosure. This method of disclosure is not to be interpreted as reflecting an intention that the claims require more features than are expressly recited. Rather, inventive aspects may lie in less than all features of each disclosed embodiment.

As will be further appreciated in light of this disclosure, with respect to the processes and methods disclosed herein, the functions performed in the processes and methods may be implemented in differing order. Additionally or alternatively, two or more operations may be performed at the same time or otherwise in an overlapping contemporaneous fashion. Furthermore, the outlined actions and operations are only provided as examples, and some of the actions and operations may be optional, combined into fewer actions and operations, or expanded into additional actions and operations without detracting from the essence of the disclosed embodiments.

Elements of different embodiments described herein may be combined to form other embodiments not specifically set forth above. Other embodiments not specifically described herein are also within the scope of the following claims.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

In the description of the various embodiments, reference is made to the accompanying drawings identified above and which form a part hereof, and in which is shown by way of illustration various embodiments in which aspects of the concepts described herein may be practiced. It is to be understood that other embodiments may be utilized, and structural and functional modifications may be made without departing from the scope of the concepts described herein. It should thus be understood that various aspects of the concepts described herein may be implemented in embodiments other than those specifically described herein. It should also be appreciated that the concepts described herein are capable of being practiced or being carried out in ways which are different than those specifically described herein.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, such recitation should be interpreted to mean at least the recited number (e.g., the bare recitation of "two widgets," without other modifiers, means at least two widgets, or two or more widgets). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

All examples and conditional language recited in the present disclosure are intended for pedagogical examples to aid the reader in understanding the present disclosure, and are to be construed as being without limitation to such specifically recited examples and conditions. Although illustrative embodiments of the present disclosure have been described in detail, various changes, substitutions, and alterations could be made hereto without departing from the scope of the present disclosure. Accordingly, it is intended that the scope of the present disclosure be limited not by this detailed description, but rather by the claims appended hereto.

What is claimed is:

1. A system comprising:
    an optically readable label provided at a U position of a plurality of U positions in a data center rack, wherein the optically readable label encodes location identifying information;
    an optical reader provided in an electronic device, the optical reader configured to sense and read the location identifying information encoded on the optically readable label in response to being mounted in the U position in the data center rack and initial power on of the electronic device; and
    an optical extension that extends from the optical reader to a front panel of the electronic device for reading the location identifying information.

2. The system of claim 1, wherein the optically readable label includes a data matrix code.

3. The system of claim 1, wherein the location identifying information includes information that indicates a location of the U position in the data center rack.

4. The system of claim 1, wherein the location identifying information includes information that identifies the data center rack.

5. The system of claim 1, wherein the electronic device is configured to send the read location identifying information to a management system, wherein the management system comprises non-transitory memory and a processor and is configured to validate the location of the electronic device.

6. The system of claim 1, wherein the electronic device is configured to not send the read location identifying information to a management system in response to a determination that a physical location of the electronic device has not changed.

7. The system of claim 1, wherein the optical extension includes an optical fiber.

8. The system of claim 1, wherein the optical extension extends to an opening in a rear-facing surface of the front panel of the electronic device.

9. The system of claim 8, wherein the opening is located in the rear-facing surface of the front panel of the electronic device to enable reading of the optically readable label by the optical reader.

10. The system of claim 1, wherein the optical extension comprises a tube with reflector elements.

11. A method comprising:
    providing an optically readable label provided at a U position of a plurality of U positions in a data center rack, wherein the optically readable label encodes location identifying information; and
    reading, by an optical reader provided in an electronic device and through an optical extension that extends from the optical reader to a front panel of the electrical device, the location identifying information encoded on the optically readable label in response to the electronic device being mounted in the U position in the data center rack and initially powered on.

12. The method of claim 11, wherein the optically readable label includes a data matrix code.

13. The method of claim 11, wherein the location identifying information includes information that indicates a location of the U position in the data center rack.

14. The method of claim 11, wherein the location identifying information includes information that identifies the data center rack.

15. The method of claim 11, wherein the electronic device is configured to send the read location identifying information to a management system, wherein the management system comprises non-transitory memory and a processor and is configured to validate the location of the electronic device.

16. The method of claim 11, wherein the electronic device is configured to not send the read location identifying information to a management system in response to a determination that a physical location of the electronic device has not changed.

17. The method of claim 11, wherein the optical extension includes an optical fiber.

18. The method of claim 11, wherein the optical extension extends to an opening in a rear-facing surface of the front panel of the electronic device.

19. The method of claim 18, wherein the opening is located in the rear-facing surface of the front panel of the electronic device to enable reading of the optically readable label by the optical reader.

20. The system of claim 11, wherein the optical extension comprises a tube with reflector elements.

* * * * *